United States Patent
Park et al.

(10) Patent No.: US 10,274,646 B2
(45) Date of Patent: Apr. 30, 2019

(54) POLARIZING PLATE AND DISPLAY DEVICE COMPRISING SAME

(71) Applicant: LG CHEM, LTD., Seoul (KR)

(72) Inventors: Jaehong Park, Daejeon (KR); Tae Ho Kim, Daejeon (KR); Dong Hoon Chung, Daejeon (KR); Min Woo Hwang, Daejeon (KR); Deok Woo Park, Daejeon (KR); Jeong Yeun Kim, Daejeon (KR); Woo Yong Cho, Daejeon (KR); Hyung Il Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 405 days.

(21) Appl. No.: 14/427,582

(22) PCT Filed: Jun. 17, 2014

(86) PCT No.: PCT/KR2014/005284
§ 371 (c)(1),
(2) Date: Mar. 11, 2015

(87) PCT Pub. No.: WO2014/204165
PCT Pub. Date: Dec. 24, 2014

(65) Prior Publication Data
US 2015/0226884 A1 Aug. 13, 2015

(30) Foreign Application Priority Data
Jun. 18, 2013 (KR) .................. 10-2013-0069822

(51) Int. Cl.
| | |
|---|---|
| G02F 1/1335 | (2006.01) |
| G02B 5/30 | (2006.01) |
| G02B 1/14 | (2015.01) |
| H01L 51/52 | (2006.01) |
| G02B 1/16 | (2015.01) |
| G02B 1/11 | (2015.01) |

(52) U.S. Cl.
CPC .............. G02B 1/14 (2015.01); G02B 5/30 (2013.01); G02F 1/133528 (2013.01); G02B 1/11 (2013.01); G02B 1/16 (2015.01); G02B 5/3033 (2013.01); H01L 51/5253 (2013.01); H01L 51/5281 (2013.01)

(58) Field of Classification Search
CPC ................................. G02F 1/133528
See application file for complete search history.

(56) References Cited

U.S. PATENT DOCUMENTS

| | | | |
|---|---|---|---|
| 2002/0015807 A1 | 2/2002 | Sugino et al. | |
| 2003/0072078 A1 | 4/2003 | Higashio et al. | |
| 2005/0206810 A1* | 9/2005 | Sasaki ................ | G02B 1/08 349/96 |

(Continued)

FOREIGN PATENT DOCUMENTS

| | | |
|---|---|---|
| JP | 2004020830 A | 1/2004 |
| JP | 2005128097 | 5/2005 |

(Continued)

Primary Examiner — Alexander P Gross
(74) Attorney, Agent, or Firm — Dentons US LLP (57) ABSTRACT

Disclosed is a polarizing plate including a polarizing film and a protective film provided on the polarizing film, and a display device having the same.

11 Claims, 3 Drawing Sheets

(56) References Cited

U.S. PATENT DOCUMENTS

| | | | |
|---|---|---|---|
| 2007/0081115 A1* | 4/2007 | Wada | G02F 1/133528 349/96 |
| 2009/0251644 A1 | 10/2009 | Park et al. | |
| 2010/0220392 A1 | 9/2010 | Tomoguchi et al. | |
| 2013/0160938 A1 | 6/2013 | Yasui et al. | |
| 2014/0098331 A1* | 4/2014 | Hisanaga | G02B 1/105 349/96 |
| 2016/0048057 A1* | 2/2016 | Sekiguchi | G02F 1/133528 349/61 |

FOREIGN PATENT DOCUMENTS

| | | |
|---|---|---|
| JP | 2009-037223 A | 2/2009 |
| JP | 2009545767 A | 12/2009 |
| JP | 2011227450 A | 11/2011 |
| KR | 20010113559 | 12/2001 |
| KR | 1020070091994 | 9/2007 |
| KR | 1020110097078 | 8/2011 |
| TW | I296727 | 9/1991 |
| WO | 2009/054376 A1 | 4/2009 |
| WO | 2012/029471 A1 | 3/2012 |

\* cited by examiner

[Plan view]

[Side view]

[Figure 4]

POLARIZING PLATE AND DISPLAY DEVICE COMPRISING SAME

TECHNICAL FIELD

This application is a National Stage Entry of International Application No. PCT/KR2014/005284, filed Jun. 17, 2014, and claims the benefit of Korean Application No. 10-2013-0069822 filed on Jun. 18, 2013, all of which are hereby incorporated by reference in their entirety for all purposes as if fully set forth herein.

The present invention relates to a polarizing plate including a polarizing film and a protective film provided on the polarizing film, and a display device having the same.

BACKGROUND ART

Recently, with a remarkable development of the information technology (IT) industry, the liquid crystal display (LCD) industry which is one of the core components of the IT industry has been also developed as a medium for transferring various information in the modern industrial society developed to be a highly developed information age.

Figure 1:
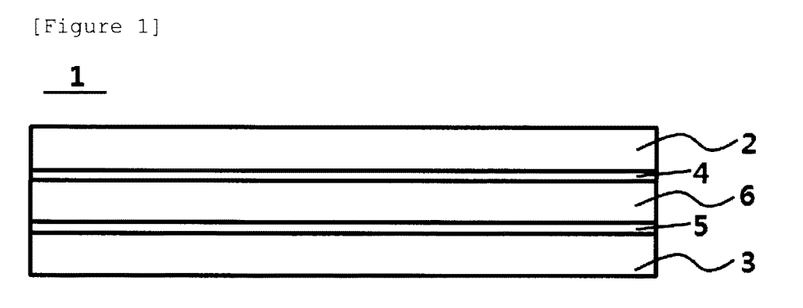
FIG. 1 is a schematic diagram illustrating a general shape of a polarizing plate.

A polarizing plate is one of the main components of a flat panel display such as an LCD or an organic EL. For example, a liquid crystal display panel has a configuration in which polarizing films are attached to both sides of a liquid crystal cell. FIG. 1 schematically illustrates a general shape of the polarizing plate. Referring to FIG. 1, a polarizing plate 1 includes a central polarizing film 6, and protective films 2 and 3 attached to both sides of the polarizing film 6 by adhesive layers 4 and 5. The protective films 2 and 3 are disposed at upper and lower sides of the polarizing film 6 to prevent the damage of the polarizing film 6.

DISCLOSURE

Technical Problem

The present invention has been made in an effort to provide a polarizing plate including a polarizing film and a protective film provided on the polarizing film, and a display device having the same.

Technical Solution

An exemplary embodiment of the present invention provides a polarizing plate including: a polarizing film; and one or more protective films provided on the polarizing film, in which a contractive force of the polarizing plate is 39 kgf or less per width of 1 mm under a condition of a temperature of 25° C. and relative humidity of 50%, in one of the transmission-axial direction and the absorption-axial direction in which the polarizing plate is more contracted under a condition of the temperature of more than 25° C. and relative humidity of more than 50%.

Another exemplary embodiment of the present invention provides a display device including the polarizing plate.

Yet another exemplary embodiment of the present invention provides a liquid crystal display including: a liquid crystal cell; an upper polarizing plate including the polarizing plate that is provided on one side of the liquid crystal cell; and a lower polarizing plate including the polarizing plate that is provided on the other side of the liquid crystal cell.

Advantageous Effects

According to the exemplary embodiment of the present invention, there is an advantage in that remaining force on a polarizing plate is small by using a polarizing plate having a low contractive force.

Further, there is an advantage in that a bending phenomenon in which a glass substrate is bent is reduced when the polarizing plate having low contractive force is used together with the glass substrate.

MODE FOR INVENTION

Hereinafter, exemplary embodiments of the present invention will be described in detail.

The present invention provides a polarizing plate including a polarizing film and one or more protective films provided on the polarizing film.

The present invention provides a polarizing plate of which contractive force is low under a condition of a temperature of 25° C. and relative humidity of 50%, in one of a transmission-axial direction and an absorption-axial direction in which the polarizing plate is more contracted under a condition of the temperature of more than 25° C. and the relative humidity of more than 50%.

In the present invention, the "one of the transmission-axial direction and the absorption-axial direction in which the polarizing plate is more contracted" means a direction having a larger average of the forces when comparing an average of forces to be contracted in the transmission-axial direction with an average of forces to be contracted in the absorption-axial direction.

In the present invention, the "one of the transmission-axial direction and the absorption-axial direction in which the polarizing plate is more contracted" means a direction further away from a measuring plate, that is, a direction in which the polarizing plate is further bent, when the polarizing plate placed on the measuring plate is bent by contraction.

In the present invention, the "condition of the temperature of more than 25° C. and the relative humidity of more than 50%" is not particularly limited if the temperature and the relative humidity are more than 25° C. and more than 50% and the polarizing plate is bent with respect to the measuring plate. For example, as one Experimental Example of the present invention, a bending amount was measured under a condition of a temperature of 80° C. or under a condition of a temperature of 60° C. and relative humidity 90%, respectively.

On the polarizing plate manufactured through a series of processes, the applied force during the processes may remain, and as a result, a strain in which the polarizing plate is contracted may occur. Particularly, as an element is thinly formed, the used glass is thinner, and influence of the strain force by which the polarizing plate is contracted on the glass has increased. Accordingly, a bending phenomenon in which the glass is bent needs to be controlled by reducing the contractive force by which the polarizing plate is strained.

Methods of decreasing the contractive force in a bending direction largely include two types. A first method is a method of decreasing contractive forces in absorption-axial and transmission-axial directions to 39 kgf/mm or less, respectively. Since the polarizing film is a film stretched in the absorption-axial direction, the polarizing film has a characteristic that the contractive force in the absorption-axial direction is high, but the contractive force in the transmission-axial direction is low. There is a method of bending a bending direction in the transmission-axial direction by increasing a contraction ratio in the transmission-axial direction by using the characteristic.

An exemplary embodiment of the present invention provides a polarizing plate including a polarizing film and one or more protective films provided on the polarizing film, in which a contractive force of the polarizing plate is 39 kgf or less per width of 1 mm under a condition of a temperature of 25° C. and relative humidity of 50%, in any one direction of the transmission-axial direction and the absorption-axial direction under a condition of the temperature of more than 25° C. and relative humidity of more than 50%. In this case, there is an advantage in that a bending phenomenon in which a substrate is bent may be reduced.

In the present invention, since the bending phenomenon in which the substrate is bent may be further reduced as the contractive force of the polarizing plate is lowered, the lowest limit of the contractive force is not particularly limited, but the contractive force of the polarizing plate is more than 0 kgf to 39 kgf or less per width of 1 mm under a condition of the temperature of 25° C. and relative humidity of 50%, in any one direction of the transmission-axial direction and the absorption-axial direction under a condition of the temperature of more than 25° C. and relative humidity of more than 50%, if necessary.

In the exemplary embodiment of the present invention, the polarizing plate includes a protective film provided on one side of the polarizing film; and a pressure-sensitive adhesive layer provided on the other side of the polarizing film, in which a contractive force of the protective film is 13 kgf or less per width of 1 mm under a condition of a temperature of 25° C. and relative humidity of 50%, in any one direction of the transmission-axial direction and the absorption-axial direction under a condition of the temperature of more than 25° C. and relative humidity of more than 50%. In this case, there is an advantage in that a bending phenomenon in which a substrate is bent may be reduced.

In the exemplary embodiment of the present invention, the polarizing plate includes a protective film provided on one side of the polarizing film; a pressure-sensitive adhesive layer provided on the other side of the polarizing film; and the other protective film between the polarizing film and the pressure-sensitive adhesive layer, in which a contractive force of the other protective film is 11 kgf or less per width of 1 mm under a condition of a temperature of 25° C. and relative humidity of 50%, in any one direction of the transmission-axial direction and the absorption-axial direction under a condition of the temperature of more than 25° C. and relative humidity of more than 50%.

In the exemplary embodiment of the present invention, the contractive force of the polarizing film may be 15 kgf or less per width of 1 mm in any one direction of the transmission-axial direction and the absorption-axial direction under a higher-temperature and humidity condition than the condition of the temperature of 25° C. and the relative humidity of 50%.

In the exemplary embodiment of the present invention, the polarizing plate includes a protective film and a brightness enhancing layer sequentially provided on one side of the polarizing film; and a pressure-sensitive adhesive layer provided on the other side of the polarizing film, in which a contractive force of the protective film is 7 kgf or less per width of 1 mm and a contractive force of the brightness enhancing layer is 21 kgf or less per width of 1 mm under a condition of a temperature of 25° C. and relative humidity of 50%, in any one direction of the transmission-axial direction and the absorption-axial direction under a condition of the temperature of more than 25° C. and the relative humidity of more than 50%. In this case, there is an advantage in that a bending phenomenon in which a substrate is bent may be reduced.

The protective film and the brightness enhancing layer may be attached to each other by the pressure-sensitive adhesive layer between the protective film and the brightness enhancing layer.

In the exemplary embodiment of the present invention, a contractive force of the polarizing film is 15 kgf or less per width of 1 mm under a condition of a temperature of 25° C. and relative humidity of 50%, in any one direction of the transmission-axial direction and the absorption-axial direction under a condition of the temperature of more than 25° C. and relative humidity of more than 50%.

An exemplary embodiment of the present invention provides a polarizing plate including a polarizing film and one or more protective films provided on the polarizing film, in which a contractive force of the polarizing plate is 39 kgf or less per width of 1 mm under a condition of a temperature of 25° C. and relative humidity of 50%, in one of the transmission-axial direction and the absorption-axial direction in which the polarizing plate is more contracted under a condition of the temperature of more than 25° C. and relative humidity of more than 50%. In this case, there is an advantage in that a bending phenomenon in which a substrate is bent may be reduced.

In the present invention, since the bending phenomenon in which the substrate is bent may be further reduced as the contractive force of the polarizing plate is lowered, the lowest limit of the contractive force is not particularly limited, but the contractive force of the polarizing plate is more than 0 kgf to 39 kgf or less per width of 1 mm under a condition of the temperature of 25° C. and relative humidity of 50%, in one of the transmission-axial direction and the absorption-axial direction in which the polarizing plate is more contracted under a condition of the temperature of more than 25° C. and relative humidity of more than 50%, if necessary.

In the exemplary embodiment of the present invention, the polarizing plate includes a protective film provided on one side of the polarizing film; and a pressure-sensitive adhesive layer provided on the other side of the polarizing film, in which a contractive force of the protective film is 13 kgf or less per width of 1 mm under a condition of a temperature of 25° C. and relative humidity of 50%, in one of the transmission-axial direction and the absorption-axial direction in which the polarizing plate is more contracted under a condition of the temperature of more than 25° C. and relative humidity of more than 50%. In this case, there is an advantage in that a bending phenomenon in which a substrate is bent may be reduced.

In the exemplary embodiment of the present invention, the polarizing plate includes a protective film provided on one side of the polarizing film; a pressure-sensitive adhesive layer provided on the other side of the polarizing film; and another protective film between the polarizing film and the pressure-sensitive adhesive layer, in which a contractive force of the other protective film is 11 kgf or less per width of 1 mm under a condition of a temperature of 25° C. and relative humidity of 50%, in one of the transmission-axial direction and the absorption-axial direction in which the polarizing plate is more contracted under a condition of the temperature of more than 25° C. and relative humidity of more than 50%.

In the exemplary embodiment of the present invention, the contractive force of the bending direction of the polarizing plate may be 15 kgf or less per width of 1 mm under a higher-temperature and humidity condition than the condition of the temperature of 25° C. and the relative humidity of 50%.

In the exemplary embodiment of the present invention, the polarizing plate includes a protective film and a brightness enhancing layer sequentially provided on one side of the polarizing film; and a pressure-sensitive adhesive layer provided on the other side of the polarizing film, in which a contractive force of the protective film is 7 kgf or less per width of 1 mm and a contractive force of the brightness enhancing layer is 21 kgf or less per width of 1 mm under a condition of a temperature of 25° C. and relative humidity of 50%, in one of the transmission-axial direction and the absorption-axial direction in which the polarizing plate is more contracted under a condition of the temperature of more than 25° C. and the relative humidity of more than 50%. In this case, there is an advantage in that a bending phenomenon in which a substrate is bent may be reduced.

The protective film and the brightness enhancing layer may be attached to each other by the pressure-sensitive adhesive layer between the protective film and the brightness enhancing layer.

In the exemplary embodiment of the present invention, a contractive force of the polarizing film may be 15 kgf or less per width of 1 mm under a condition of a temperature of 25° C. and relative humidity of 50%, in one of the transmission-axial direction and the absorption-axial direction in which the polarizing plate is more contracted under a condition of the temperature of more than 25° C. and relative humidity of more than 50%.

Here, the contractive force means a force when the film is strained and then restored to an original state. Since it is difficult to measure a force when the film is actually contracted, the contractive force is estimated by measuring a force required when the film is forcibly stretched (tensioned). That is, the contractive force is represented by a tensile strength, and as a research result, it is determined that the tensile strength may correspond to the contractive force.

In this case, the contractive force (tensile strength) is measured by the following method.

1. In an environment of a room temperature (25° C.) and room humidity (50%), a sample is cut with a width of 10 mm and a length of 150 mm and then installed in a length direction on a universal tester, and any one of both fixed ends is pulled.

2. While the sample is forcibly stretched, a percentage strain and a load applied to the film are simultaneously measured to obtain a percentage strain-load graph like FIG. 2.

Figure 2:
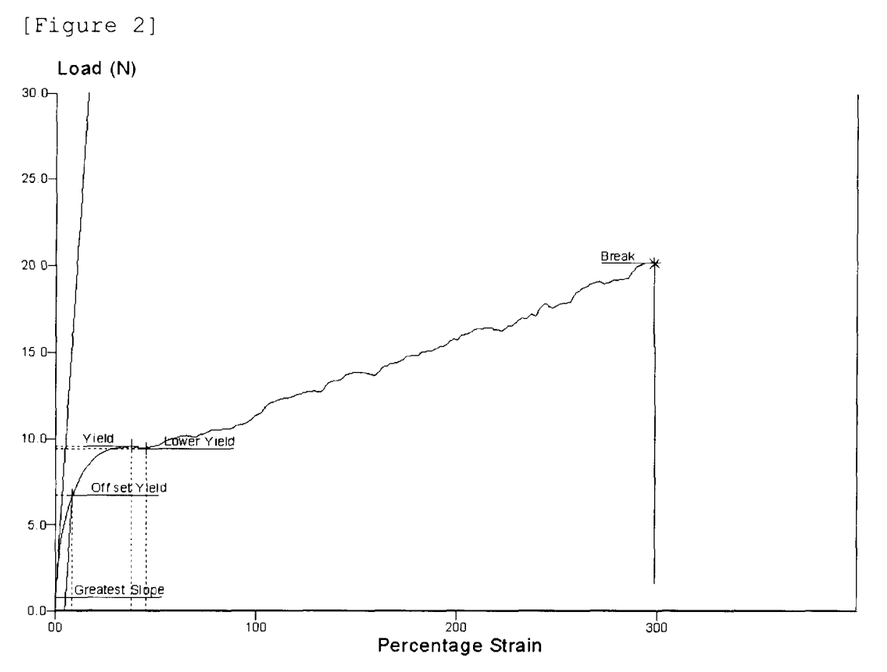
FIG. 2 is an example of a percentage strain-load graph for measuring contractive force in the present invention.
Figure 3:
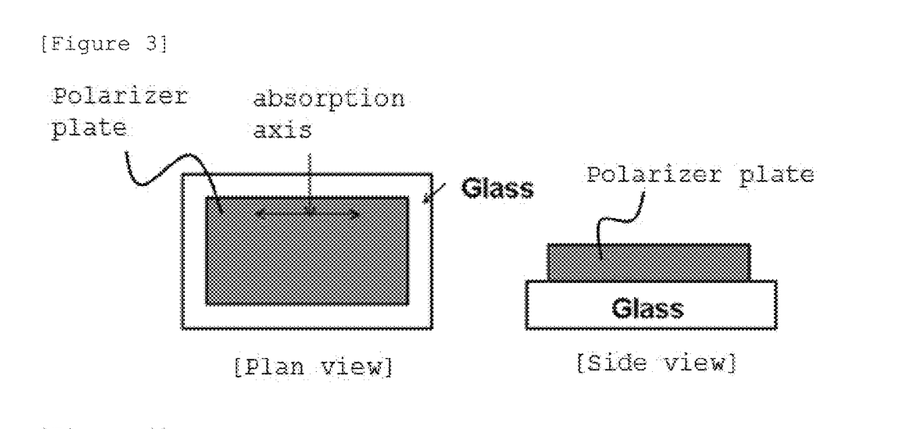
FIG. 3 is a plan view and a side view of a sample in Experimental Example 1.

3. In the percentage strain-load graph, the contractive force is calculated by the greatest slope among tangential slopes.

In order to reduce the bending under a high-temperature or high-temperature and humidity condition, companies of the polarizing plate conducted a lot of researches for reducing the contractive force. However, under the high-temperature or high-temperature and humidity condition, it was very difficult to quantify the contractive force of the polarizing plate. The applicants conducted efforts to find factors which represent the contractive force, and as a result, measured the tensile strength under the room-temperature and humidity condition and found that values obtained by converting a unit from kgf/mm2 to kgf/mm represent the contractive force. The film having a high contraction amount in the transmission-axial direction is attached to the polarizing film to induce bending in the transmission-axial direction, thereby reducing the contractive force in the bending direction.

In this case, the contraction amount means a dimension variation which is rapidly changed when the polarizing film is removed from a high-temperature and humidity chamber. In addition, in order to bend the polarizing film in the transmission-axial direction, as soon as the polarizing film is removed from the chamber, rapid dimension contraction in the transmission-axial direction needs to occur.

In the exemplary embodiment of the present invention, the polarizing plate includes a protective film of which a contraction amount in the transmission-axial direction after 1 hour after the protective film is removed from a chamber at 80° C. is 100 μm or more based on a size or a length just before the protective film is removed from the chamber at 80° C., in which a contractive force of the protective film is 13 kgf or less per width of 1 mm under a condition of a temperature of 25° C. and relative humidity of 50%, in any one direction of the transmission-axial direction and the absorption-axial direction under a condition of the temperature of more than 25° C. and relative humidity of more than 50%.

In the exemplary embodiment of the present invention, the polarizing plate includes a protective film of which a contraction amount in the transmission-axial direction after 1 hour after the protective film is removed from a chamber at 80° C. is 100 μm or more based on a size or a length just before the protective film is removed from the chamber at 80° C., in which a contractive force of the polarizing film is 15 kgf or less per width of 1 mm under a condition of a temperature of 25° C. and relative humidity of 50%, in any one direction of the transmission-axial direction and the absorption-axial direction under a condition of the temperature of more than 25° C. and relative humidity of more than 50%.

In the present invention, there is an advantage in that the contraction of the polarizing plate and the bending phenomenon of the glass are reduced by a residue force remaining on the polarizing plate by using the polarizing plate having a low contractive force in the absorption-axial direction or the transmission-axial direction.

A material and a manufacturing method of the polarizing film are not particularly limited if the polarizing plate with the protective film on one side or both sides of the polarizing film has the contractive force satisfying the range of the present invention, and may use general material and manufacturing method which are known in the art.

In the exemplary embodiment of the present invention, the polarizing film may be a polyvinylalcohol-based polarizing film.

There is an advantage in that the contractive force of the polarizing plate is smaller as the contractive force of the polarizing film is smaller. There is an advantage in that the contraction of the polarizing plate and the bending phenomenon of the glass are reduced as the contractive force of the polarizing film is smaller.

The applicants found that the contractive force is reduced as the thickness of the film is smaller through an experiment of a contractive force according to a thickness.

Accordingly, since the contractive force is reduced and the bending phenomenon in which the substrate is bent may be further reduced as the thickness of the polarizing film is smaller, the dimensional range of the thickness of the polarizing film is not particularly limited. The thickness of the polarizing film may be more than 0 μm to less than 50 and in this case, there is an advantage in that the bending phenomenon in which the substrate is bent may be reduced.

If necessary, the thickness of the polarizing film may be more than 0 μm to 10 μm or less. In this case, since the contractive force of the polarizing film is further decreased, there is an advantage in that the bending phenomenon in which the substrate is bent may be further reduced.

A material and a manufacturing method of the protective film are not particularly limited if the polarizing plate in which the protective film is provided in the polarizing film has the contractive force satisfying the range of the present invention, and may use general material and manufacturing method which are known in the art.

In the exemplary embodiment of the present invention, the protective film may includes one or more films, and may be manufactured by at least one of a cycloolefin polymer (COP)-based film, an acryl-based film, a triacetylcellulose (TAC)-based film, a cycloolefin copolymer (COC)-based film, a polynorbornene (PNB)-based film, and a polyethylene terephtalate (PET)-based film.

The exemplary embodiment of the present invention may include a pressure-sensitive adhesive layer positioned on the polarizing film or the protective film. Here, "on the polarizing film" means an opposite side of a side with the protective film based on the polarizing film, and "on the protective film" means an opposite side of a side with the polarizing film based on the protective film.

The pressure-sensitive adhesive layer is provided so as to be applied to a display device such as a liquid crystal display device.

For example, a surface with the pressure-sensitive adhesive layer is attached to a liquid crystal cell of the liquid crystal display device to be applied to the display device. In this case, the protective film attached to the liquid crystal cell may have a specific phase difference for viewing angle compensation.

In the exemplary embodiment of the present invention, the protective film may include one or more additives selected from a UV absorber, an anti-blocking agent, a lubricant, an antistatic agent, and a stabilizer, if necessary.

In the exemplary embodiment of the present invention, one or more layers of an anti-reflection layer, a low-reflection coating layer, a UV absorbing layer, a brightness enhancing layer, an antistatic coating layer, an antiglare layer, a liquid crystal coating layer, and a hard coat layer may be additionally included on an upper surface or a lower surface of the protective film, if necessary.

In the exemplary embodiment of the present invention, permeability of the protective film may be 40 g/m$^2$ day or less.

The protective film and the polarizing film may be attached by an aqueous or non-aqueous adhesive.

In the exemplary embodiment of the present invention, in the case where the polarizing plate includes the protective film provided on one side of the polarizing film and the pressure-sensitive adhesive layer provided on the other side of the polarizing film, the protective film which is attached to the liquid crystal cell by the pressure-sensitive adhesive layer provided on the other side of the polarizing film and provided on one side of the polarizing film is relatively positioned at the outside.

In the exemplary embodiment of the present invention, in the case where the polarizing plate includes the protective film provided on one side of the polarizing film, the pressure-sensitive adhesive layer provided on the other side of the polarizing film, and the other protective film between the polarizing film and the pressure-sensitive adhesive layer, the protective film which is attached to the liquid crystal cell by the pressure-sensitive adhesive layer formed on the other protective film and provided on one side of the polarizing film is relatively positioned at the outside.

As such, the protective film positioned at the outside may include a UV absorber or a UV absorbing layer on the upper surface or lower surface.

In the case where the polarizing plates are provided on both sides of the liquid crystal cell, in an upper polarizing plate which is relatively far away from the ground surface based on the liquid crystal cell, at least one layer of a hard coating layer, a low-reflection coating layer, and an anti glare layer may be additionally provided on the upper surface or lower surface of the protective film positioned at the outside.

In the case where the polarizing plates are provided on both sides of the liquid crystal cell, in a lower polarizing plate which is relatively close to the ground surface based on the liquid crystal cell, the brightness enhancing layer may be additionally provided on the upper surface or lower surface of the protective film positioned at the outside.

The applicants found that the contractive force is reduced as the thickness of the film is smaller through an experiment of a contractive force according to a thickness.

In the present invention, since the bending phenomenon in which the substrate is bent may be further reduced as the thickness of the polarizing film is smaller, the dimensional range of the thickness of the polarizing film is not particularly limited. The thickness of the polarizing film may be more than 0 μm to less than 60 μm, and in this case, there is an advantage in that the bending phenomenon in which the substrate is bent may be reduced.

As necessary, the thickness of the protective film may be 15 to 45 μm, and if necessary, may be 20 to 30 μm.

The thickness of the protective film manufactured by an acryl-based film or a TAC-based film may be 15 to 45 μm. In the case where the protective film is manufactured by the acryl-based film or the TAC-based film, the contractive force of the protective film is 13 kgf or less per width of 1 mm under a condition of a temperature of 25° C. and relative humidity of 50%, in any one direction of the transmission-axial direction and the absorption-axial direction in which the polarizing plate is further contracted under a condition of the temperature of more than 25° C. and relative humidity of more than 50%, and there is an advantage in that the bending phenomenon in which the substrate is bent may be reduced.

Another exemplary embodiment of the present invention provides a display device including the polarizing plate. The display device may be any one of a touch panel, a light emitting diode (LED), an organic light emitting diode (OLED), a liquid crystal display (LCD), and a thin film transistor-liquid crystal display (LCD-TFT).

The thickness of a glass substrate provided in the display device may be 0.1 mm to 0.7 mm, and may be selected according to an applied element.

Yet another exemplary embodiment of the present invention provides a liquid crystal display including the polarizing plate.

The liquid crystal display may include a liquid crystal cell and the polarizing plate provided on one side or both sides of the liquid crystal cell.

In this case, the liquid crystal cell and the polarizing plate may be attached to each other by the pressure-sensitive adhesive layer provided on the polarizing film or the protective film.

Hereinafter, the present invention will be described in more detail with reference to Examples and Comparative Examples. However, the following Examples and Comparative Examples are just to exemplify the present invention, but the present invention is not limited thereto.

EXAMPLES

Example 1

TABLE 1

| COP |
| Polarizing film |
| TD-stretched COP |
| Pressure-sensitive adhesive layer (PSA) |

Like the structure like Table 1, the polarizing plate was manufactured by attaching COP-based films having thicknesses of 23 μm to both sides of a polyvinylalcohol polarizer film of which a thickness is 12 μm, a contractive force in the absorption-axial direction is 35 kgf per width of 1 mm, and a contractive force in the transmission-axial direction is 7 kgf per width of 1 mm by using a non-aqueous adhesive, respectively.

In this case, the COP-based film has the thickness of 23 μm, the contractive force in the absorption-axial direction of 6 kgf per width of 1 mm, and the contractive force in the transmission-axial direction of 6 kgf per width of 1 mm.

Comparative Example 1

TABLE 2

| Hard coating layer |
| Acryl film |
| Polarizing film |
| COP |
| Liquid crystal coating layer |
| Pressure-sensitive adhesive layer (PSA) |

Like the structure like Table 2, the polarizing plate was manufactured by attaching a first protective film and a second protective film to both sides of a polyvinylalcohol polarizing film of which a thickness is 12 μm, a contractive force in the absorption-axial direction is 35 kgf per width of 1 mm, and a contractive force in the transmission-axial direction is 7 kgf per width of 1 mm by using a non-aqueous adhesive, respectively.

The COP-based film having the thickness of 23 μm was used as the first protective film, and the liquid crystal coating layer having the thickness of 1 μm was formed on one side of the first protective film. In the COP-based film formed with the liquid crystal coating layer, the contractive force in the absorption-axial direction is 6 kgf per width of 1 mm, and the contractive force in the transmission-axial direction is 6 kgf per width of 1 mm.

The pressure-sensitive adhesive layer having the thickness of 22 μm was formed on the liquid crystal coating layer.

Further, the acryl-based film having the thickness of 40 μm was used as the second protective film, and the hard coating layer having the thickness of 5 μm was formed on one side of the second protective film. In the acryl-based film formed with the hard coating layer, the contractive force in the absorption-axial direction is 18 kgf per width of 1 mm, and the contractive force in the transmission-axial direction is 19 kgf per width of 1 mm.

Comparative Example 2

TABLE 3

| Anti glare layer |
| Acryl film |
| Polarizing film |
| Acryl film |
| Pressure-sensitive adhesive layer (PSA) |

Like the structure like Table 3, the polarizing plate was manufactured by attaching a first protective film and a second protective film to both sides of a polyvinylalcohol polarizing film of which a thickness is 12 μm, a contractive force in the absorption-axial direction is 35 kgf per width of 1 mm, and a contractive force in the transmission-axial direction is 7 kgf per width of 1 mm by using a non-aqueous adhesive, respectively.

As the first protective film, the acryl-based film having the thickness of 40 μm was formed. In the acryl-based film, the contractive force in the absorption-axial direction is 16 kgf per width of 1 mm, and the contractive force in the transmission-axial direction is 17 kgf per width of 1 mm.

The pressure-sensitive adhesive layer having the thickness of 22 μm was formed on one side of the first protective film.

Further, the acryl-based film having the thickness of 40 μm was used as the second protective film, and the anti glare layer having the thickness of 5 μm was formed on one side of the second protective film. In the acryl-based film formed with the anti glare layer, the contractive force in the absorption-axial direction is 19 kgf per width of 1 mm, and the contractive force in the transmission-axial direction is 21 kgf per width of 1 mm.

Comparative Example 3

TABLE 4

| Hard coating layer |
| COP |
| Polarizing film |
| COP |
| Liquid crystal coating layer |
| Pressure-sensitive adhesive layer (PSA) |

Like the structure like Table 4, the polarizing plate was manufactured by attaching a first protective film and a second protective film to both sides of a polyvinylalcohol polarizing film of which a thickness is 12 μm, a contractive force in the absorption-axial direction is 35 kgf per width of 1 mm, and a contractive force in the transmission-axial direction is 7 kgf per width of 1 mm by using a non-aqueous adhesive, respectively.

The COP-based film having the thickness of 23 μm was used as the first protective film, and the liquid crystal coating layer having the thickness of 1 μm was formed on one side of the first protective film. In the COP-based film formed with the liquid crystal coating layer, the contractive force in the absorption-axial direction is 6 kgf per width of 1 mm, and the contractive force in the transmission-axial direction is 7 kgf per width of 1 mm.

The pressure-sensitive adhesive layer having the thickness of 22 vim was formed on the liquid crystal coating layer.

Further, the COP-based film having the thickness of 40 μm was used as the second protective film, and the hard coating layer having the thickness of 7 vim was formed on one side of the second protective film. In the COP-based film formed with the hard coating layer, the contractive force in the absorption-axial direction is 6 kgf per width of 1 mm, and the contractive force in the transmission-axial direction is 7 kgf per width of 1 mm.

Experimental Example 1

Bending Experiment Under Heat-Resistance Condition (80° C., Humidity 90%, 24 Hours)

A sample was manufactured by cutting the polarizing plate manufactured in Example and Comparative Examples with a size of 200 mm×150 mm. In this case, the sample was manufactured so that a length in the absorption-axial direction is large, that is, the length in the absorption-axial direction is 200 mm.

The sample was manufactured by attaching the manufactured polarizing plate with the size of 200 mm×150 mm to the center of a glass substrate with the size of 210 mm×160 mm (thickness of 0.4 mm). Thereafter, the sample attached to the glass substrate was left in a chamber at 80° C. and humidity 90% for 24 hours. The sample was removed after being left for 24 hours in the chamber, and then left for 24 hours at a room temperature (25° C., humidity 50%), and the bending was measured.

Figure 4:
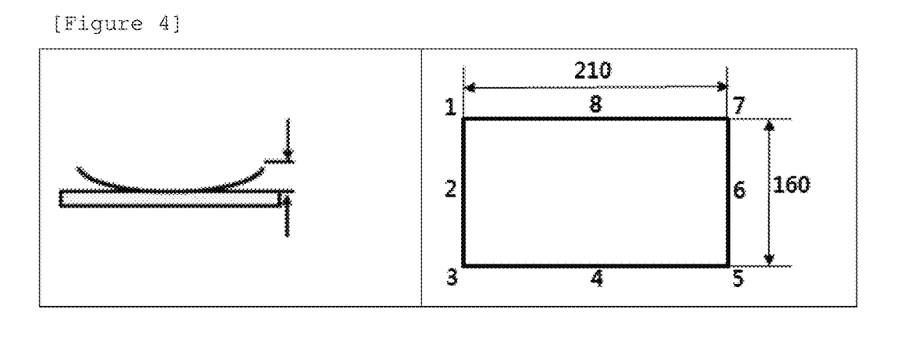
FIG. 4 is a drawing for measuring a lifting degree from the granite plate in Experimental Example 1.

In this case, a bending degree was measured by placing the sample on a flat granite plate (placing the glass substrate to face the granite plate) and measuring a lifting degree from the granite plate like FIG. 4 by using a ruler at the following positions 1 to 8, or measured by using a 3D measuring machine. The largest value of distances far away from the granite plate at the following positions 1 to 8 was defined as a bending amount of the polarizing plate.

TABLE 5

|  | Example 1 | Comparative Example 1 | Comparative Example 2 | Comparative Example 3 |
| --- | --- | --- | --- | --- |
| Bending amount | 1.3 mm | 5.6 mm | 6.5 mm | 4.6 mm |

In Example 1, the sample was bent in the transmission-axial direction under a heat-resistance condition (80° C., humidity 90%, 24 hours), and in the rest of Comparative Examples 1 to 3, the sample was bent in the absorption-axial direction.

As a result, the contractive force of Example 1 disclosed in Table 5 is the contractive force in the transmission-axial direction, and the contractive force of Comparative Examples 1 to 3 is the contractive force in the absorption-axial direction.

Experimental Example 2

Bending Experiment Under a Heat-Resistance and Moisture-Resistance Condition (60° C., Humidity 90%, 24 Hours)

A sample attached to the glass substrate is the same as that of Experiment Example 1, except that the sample is left in a chamber at 60° C. and humidity 90% for 24 hours. The result was illustrated in the following Table 8.

TABLE 6

|  | Example 1 | Comparative Example 1 | Comparative Example 2 | Comparative Example 3 |
| --- | --- | --- | --- | --- |
| Bending amount | 0.6 mm | 2.4 mm | 3.0 mm | 1.2 mm |

In Example 1, the sample was bent in the transmission-axial direction under a heat-resistance and moisture-resistance condition (60° C., humidity 90%, 24 hours), and in the rest of Comparative Examples 1 to 3, the sample was bent in the absorption-axial direction.

As a result, the contractive force of Example 1 disclosed in Table 6 is the contractive force in the transmission-axial direction, and the contractive force of Comparative Examples 1 to 3 is the contractive force in the absorption-axial direction.

EXPLANATION OF REFERENCE NUMERALS

1: Polarizing plate
2, 3: Protective film
4, 5: Adhesive layer
6: Polarizing film
7: Pressure-sensitive adhesive

The invention claimed is:
1. A polarizing plate, comprising:
a polarizing film; and one or more protective films provided on the polarizing film,
wherein a contractive force of the polarizing plate is 39 kgf or less per width of 1 mm under a condition of a temperature of 25° C. and relative humidity of 50%, in one of the transmission-axial direction and the absorption-axial direction in which the polarizing plate is more contracted under a condition of the temperature of more than 25° C. and the relative humidity of more than 50%,
wherein the polarizing plate includes a protective film and a liquid crystal coating layer sequentially provided on one side of the polarizing film; and a first pressure-sensitive adhesive layer provided on the other side of the polarizing film, and a contractive force of the protective film is 7 kgf or less per width of 1 mm under a condition of a temperature of 25° C. and relative humidity of 50%, in one of the transmission-axial direction and the absorption-axial direction in which the polarizing plate is more contracted under a condition of the temperature of more than 25° C. and relative humidity of more than 50%,
wherein a contractive force of the polarizing film is 15 kgf or less per width of 1 mm under a condition of a temperature of 25° C. and relative humidity of 50%, in one of the transmission-axial direction and the absorption-axial direction in which the polarizing plate is more contracted under a condition of the temperature of more than 25° C. and the relative humidity of more than 50%, and wherein the protective film includes at least one of a cycloolefin polymer(COP)-based film, a cycloolefin copolymer (COC)-based film, and a polynorbornene (PNB)-based film.

2. The polarizing plate of claim 1, further comprising:

another protective film between the polarizing film and the pressure-sensitive adhesive layer, wherein a contractive force of the other protective film is 11 kgf or less per width of 1 mm under a condition of a temperature of 25° C. and relative humidity of 50%, in one of the transmission-axial direction and the absorption-axial direction in which the polarizing plate is more contracted under a condition of the temperature of more than 25° C. and relative humidity of more than 50%.

3. The polarizing plate of claim 1, wherein the polarizing plate includes the protective film which is provided on one side of the polarizing film and of which a contraction amount in the transmission-axial direction after 1 hour after the protective film is removed from a chamber at 80° C. is 100 μm or more based on just before the protective film is removed from the chamber at 80° C., and a contractive force of the protective film is 7 kgf or less per width of 1 mm under a condition of a temperature of 25° C. and relative humidity of 50%, in any one direction of the transmission-axial direction and the absorption-axial direction under a condition of the temperature of more than 25° C. and relative humidity of more than 50%.

4. The polarizing plate of claim 1, wherein the polarizing plate includes the protective film which is provided on one side of the polarizing film and of which a contraction amount in the transmission-axial direction after 1 hour after the protective film is removed from a chamber at 80° C. is 100 μm or more based on just before the protective film is removed from the chamber at 80° C., and a contractive force of the polarizing film is 15 kgf or less per width of 1 mm under a condition of a temperature of 25° C. and relative humidity of 50%, in any one direction of the transmission-axial direction and the absorption-axial direction under a condition of the temperature of more than 25° C. and relative humidity of more than 50%.

5. The polarizing plate of claim 1, wherein the polarizing film is a polyvinylalcohol-based polarizing film.

6. The polarizing plate of claim 1, wherein the protective film includes one or more additives selected from a UV absorber, an anti-blocking agent, a lubricant, an antistatic agent, and a stabilizer.

7. The polarizing plate of claim 1, wherein one or more layers selected from an anti-reflection layer, a low-reflection coating layer, a UV absorbing layer, a brightness enhancing layer, an antistatic coating layer, an antiglare layer, and a hard coat layer are additionally included on the protective film.

8. The polarizing plate of claim 1, wherein permeability of the protective film is 40 $g/m^2$ day or less.

9. The polarizing plate of claim 1, wherein a thickness of the polarizing film is 10 μm or less.

10. A display device including the polarizing plate according to claim 1.

11. A liquid crystal display, comprising:

a liquid crystal cell; an upper polarizing plate that is provided on one side of the liquid crystal cell; and a lower polarizing plate that is provided on the other side of the liquid crystal cell, wherein each of the upper polarizing plate and the lower polarizing plate comprises the polarizing plate according to claim 1.

* * * * *